US012331229B2

(12) United States Patent
Jo

(10) Patent No.: US 12,331,229 B2
(45) Date of Patent: Jun. 17, 2025

(54) SILICONE ADHESIVE COMPOSITION AND METHODS FOR ITS PREPARATION AND USE FOR ELECTRONIC DEVICE FABRICATION

(71) Applicant: Dow Silicones Corporation, Midland, MI (US)

(72) Inventor: Gunn Jo, Chungcheongbuk-do (KR)

(73) Assignee: Dow Silicones Corporation, Midland, MI (US)

( * ) Notice: Subject to any disclaimer, the term of this patent is extended or adjusted under 35 U.S.C. 154(b) by 147 days.

(21) Appl. No.: 17/911,707

(22) PCT Filed: Mar. 24, 2021

(86) PCT No.: PCT/US2021/023865
§ 371 (c)(1),
(2) Date: Sep. 15, 2022

(87) PCT Pub. No.: WO2021/236229
PCT Pub. Date: Nov. 25, 2021

(65) Prior Publication Data
US 2023/0313008 A1   Oct. 5, 2023

Related U.S. Application Data

(60) Provisional application No. 63/026,789, filed on May 19, 2020.

(51) Int. Cl.
*C09J 183/06* (2006.01)
*G06V 40/13* (2022.01)
*H10K 77/10* (2023.01)

(52) U.S. Cl.
CPC ............. *C09J 183/06* (2013.01); *G06V 40/13* (2022.01); *H10K 77/10* (2023.02)

(58) Field of Classification Search
CPC ........ C09J 183/06; G06V 40/13; H10K 77/10
USPC ......................................................... 524/860
See application file for complete search history.

(56) References Cited

U.S. PATENT DOCUMENTS

| | | | |
|---|---|---|---|
| 2,676,182 | A | 4/1954 | Daudt et al. |
| 4,510,094 | A * | 4/1985 | Drahnak ............. C07F 15/0086 556/136 |
| 4,530,879 | A | 7/1985 | Drahnak |
| 4,584,355 | A | 4/1986 | Blizzard et al. |
| 4,585,836 | A | 4/1986 | Homan et al. |
| 4,591,622 | A | 5/1986 | Blizzard et al. |
| 4,611,042 | A | 9/1986 | Rivers-Farrell et al. |
| 4,774,310 | A | 9/1988 | Butler |
| 4,916,169 | A | 4/1990 | Boardman et al. |
| 5,145,886 | A | 9/1992 | Oxman et al. |
| 5,496,961 | A | 3/1996 | Dauth et al. |
| 6,046,250 | A | 4/2000 | Boardman et al. |
| 6,252,028 | B1 | 6/2001 | Fehn et al. |
| 8,580,073 | B2 | 11/2013 | Behl et al. |
| 9,593,209 | B2 | 3/2017 | Dent et al. |
| 2017/0283665 | A1 | 10/2017 | Lee et al. |

FOREIGN PATENT DOCUMENTS

| | | | |
|---|---|---|---|
| EP | 0398701 A2 | 11/1990 | |
| EP | 3517292 A1 * | 7/2019 | ............. B32B 13/045 |
| WO | WO-2019079366 A1 * | 4/2019 | ............. B32B 37/12 |

* cited by examiner

*Primary Examiner* — Ling Siu Cho
*Assistant Examiner* — Ronald Grinsted
(74) *Attorney, Agent, or Firm* — Catherine U. Brown

(57) ABSTRACT

A UV curable silicone adhesive composition and method for its preparation are provided. The UV curable silicone adhesive composition is useful in electronic device fabrication for adhering components such as fingerprint sensors to substrates, such as OLED display devices.

15 Claims, No Drawings

SILICONE ADHESIVE COMPOSITION AND METHODS FOR ITS PREPARATION AND USE FOR ELECTRONIC DEVICE FABRICATION

CROSS REFERENCE TO RELATED APPLICATIONS

This application is a U.S. national stage filing under 35 U.S.C. § 371 of PCT Application No. PCT/US21/023865 filed on 24 Mar. 2021, currently pending, which claims the benefit of U.S. Provisional Patent Application No. 63/026,789 filed 19 May 2020 under 35 U.S.C. § 119(e). PCT Application No. PCT/US21/023865 and U.S. Provisional Patent Application No. 63/026,789 are each hereby incorporated by reference.

TECHNICAL FIELD

A silicone adhesive composition and method for its preparation are disclosed. The silicone adhesive composition is curable by exposure to UV radiation to form a silicone adhesive. The silicone adhesive composition is useful in electronic device fabrication.

BACKGROUND

Optical fingerprint scanning sensors are used in various electronic devices that let users access information easily, such as mobile telephones, mobile television receivers, wireless devices, smartphones, personal data assistants, wireless electronic mail receivers, hand-held or portable computers, netbooks, notebooks, smartbooks, tablets, global positioning system receivers/navigators, cameras, digital media players, camcorders, game consoles, and electronic reading devices. During fabrication of the device, the optical fingerprint scanning sensor may be attached to a display using an adhesive. In an exemplary process, an assembly may be formed by dispensing a wet adhesive composition on the backside of an organic light emitting diode (OLED) display, applying the optical fingerprint scanning sensor to the wet adhesive composition opposite the display, and applying pressure to the resulting assembly until the wet adhesive composition develops sufficient green strength for the pressure to be removed, and/or the assembly to be moved, without damage to the assembly.

Conventional silicone adhesive compositions have been proposed for this application. However, these may not be cost effective because they can suffer from the drawbacks of taking undesirably long to develop green strength, thereby slowing production, or requiring high loadings of catalyst to accelerate cure, which can significantly increase cost of the adhesive.

There is a need in the electronic device industry to provide a cost effective adhesive composition that is dispensable onto a substrate, such as a display, using conventional dispensing equipment, where the adhesive composition quickly develops green strength after an adherend, such as an optical fingerprint scanning sensor, is attached thereto.

SUMMARY

A silicone adhesive composition comprises: (A) a bis-vinyl terminated polydiorganosiloxane polymer, (B) a polydiorganosiloxane gum, (C) a polyorganohydrogensiloxane crosslinker, and (D) a ($\eta$-cyclopentadienyl)tri($\sigma$-aliphatic)-platinum complex. The silicone adhesive composition can be dispensed on a substrate, exposed to UV radiation, and used to adhere an (opto)electronic component to the substrate.

DETAILED DESCRIPTION

The silicone adhesive composition described above comprises:
- 100 parts by weight of (A) the bis-vinyl terminated polydiorganosiloxane polymer,
- 5 to 20 parts by weight (B) the polydiorganosiloxane gum,
- (C) the polyorganohydrogensiloxane crosslinker, in an amount sufficient to provide an SiH/Vi ratio of >0.3,
- (D) the ($\eta$-cyclopentadienyl)tri($\sigma$-aliphatic)-platinum complex in an amount sufficient to provide 1 to 20 ppm platinum, based on combined weights of all starting materials in the composition.

The silicone adhesive composition may optionally further comprise one or more additional starting materials, which may be selected from the group consisting of: (E) a solvent, (F) a polyorganosilicate resin, (G) an adhesion promoter, and (H) a combination of two or more of (E), (F), and (G).

(A) Polymer

The silicone adhesive composition described above comprises 100 parts by weight of starting material (A), a bis-vinyl terminated polydiorganosiloxane polymer ("polymer"). The polymer may comprise unit formula:

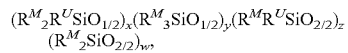

where each $R^M$ is an independently selected monovalent hydrocarbon group of 1 to 30 carbon atoms that is free of aliphatic unsaturation; each $R^U$ is a group of formula $CH_2$=CH-D-, where each D is a covalent bond or an independently selected divalent hydrocarbon group of 1 to 28 carbon atoms; subscripts w, x, y, and z have values such that x≥0, y≥0, (x+y)=2, z≥0, and w≥0, a quantity (x+z)>0, and a quantity (z+w) is sufficient to give the polydiorganosiloxane polymer a number average molecular weight of 10,000 g/mol to 300,000 g/mol, alternatively 20,000 g/mol to 200,000 g/mol, alternatively 30,000 g/mol to 100,000 g/mol, alternatively 40,000 g/mol to 80,000 g/mol, alternatively 50,000 g/mol to 75,000 g/mol, alternatively 50,000 g/mol to 75,000 g/mol, and alternatively 59,000 g/mol to 67,000 g/mol. Alternatively, x=2 and z=0. Alternatively, 10≤(x+y+z+w)≤500.

Each $R^M$ is an independently selected monovalent hydrocarbon group of 1 to 30 carbon atoms that is free of aliphatic unsaturation. Alternatively, each $R^M$ may have 1 to 12 carbon atoms, and alternatively 1 to 6 carbon atoms. Suitable monovalent hydrocarbon groups for $R^M$ are exemplified by alkyl groups and aromatic groups such as aryl groups and aralkyl groups. "Alkyl" means a cyclic, branched, or unbranched, saturated monovalent hydrocarbon group. Alkyl is exemplified by, but not limited to, methyl, ethyl, propyl (e.g., iso-propyl and/or n-propyl), butyl (e.g., isobutyl, n-butyl, tert-butyl, and/or sec-butyl), pentyl (e.g., isopentyl, neopentyl, and/or tert-pentyl), hexyl, heptyl, octyl, nonyl, and decyl, and branched alkyl groups of 6 or more carbon atoms; and cyclic alkyl groups such as cyclopentyl and cyclohexyl. "Aryl" means a cyclic, fully unsaturated, hydrocarbon group. Aryl is exemplified by, but not limited to, cyclopentadienyl, phenyl, anthracenyl, and naphthyl. Monocyclic aryl groups may have 5 to 9 carbon atoms, alternatively 6 to 7 carbon atoms, and alternatively 5 to 6 carbon atoms. Polycyclic aryl groups may have 10 to 17 carbon atoms, alternatively 10 to 14 carbon atoms, and alternatively 12 to 14 carbon atoms. "Aralkyl" means an alkyl group having a pendant and/or terminal aryl group or an aryl group having a pendant alkyl group. Exemplary aralkyl groups include tolyl, xylyl, benzyl, phenylethyl, phenyl propyl, and phenyl butyl. Alternatively, each $R^M$ may be independently selected from the group consisting of alkyl and aryl. Alternatively, each $R^M$ may be independently selected from methyl and phenyl. Alternatively, each $R^M$ may be alkyl. Alternatively, each $R^M$ may be methyl.

Each $R^U$ is a group of formula $CH_2$=CH-D-, where each D is a covalent bond or an independently selected divalent hydrocarbon group of 1 to 28 carbon atoms, e.g., the divalent hydrocarbon group for D may have formula —$(CH_2)_x$—, where subscript x is 1 to 28, such as methylene, ethylene, propylene, or butylene. When D is a covalent bond, then $R^U$ is a vinyl group. Alternatively, when D is a divalent hydrocarbon group, then $R^U$ may be an alkenyl group with 3 to 30 carbon atoms and a terminal vinyl functionality, such as allyl, butenyl, hexenyl, or octenyl. Alternatively, each $R^U$ may be alkenyl, such as vinyl, allyl, or hexenyl. Alternatively, each $R^U$ may be independently selected from the group consisting of vinyl and hexenyl.

Polymers suitable for use as starting material (A) are known in the art and may be prepared by methods such as hydrolysis and condensation of the corresponding organohalosilanes or equilibration of cyclic polydiorganosiloxanes. Examples of suitable polymers for use as starting material (A) in the composition are exemplified by:
i) bis-dimethylvinylsiloxy-terminated polydimethylsiloxane,
ii) bis-dimethylvinylsiloxy-terminated poly(dimethylsiloxane/methylvinylsiloxane),
iii) bis-dimethylvinylsiloxy-terminated polymethylvinylsiloxane,
iv) bis-trimethylsiloxy-terminated poly(dimethylsiloxane/methylvinylsiloxane),
v) bis-trimethylsiloxy-terminated polymethylvinylsiloxane,
vi) bis-dimethylvinylsiloxy-terminated poly(dimethylsiloxane/methylvinylsiloxane),
vii) bis-dimethylvinylsiloxy-terminated poly(dimethylsiloxane/methylphenylsiloxane),
viii) bis-dimethylvinylsiloxy-terminated poly(dimethylsiloxane/diphenylsiloxane),
ix) bis-phenyl,methyl,vinyl-siloxy-terminated polydimethylsiloxane,
x) bis-dimethylhexenylsiloxy-terminated polydimethylsiloxane,
xi) bis-dimethylhexenylsiloxy-terminated poly(dimethylsiloxane/methylhexenylsiloxane),
xii) bis-dimethylhexenylsiloxy-terminated polymethylhexenylsiloxane,
xiii) bis-trimethylsiloxy-terminated poly(dimethylsiloxane/methylhexenylsiloxane),
xiv) bis-trimethylsiloxy-terminated polymethylhexenylsiloxane
xv) bis-dimethylhexenyl-siloxy terminated poly(dimethylsiloxane/methylhexenylsiloxane),
xvi) bis-dimethylvinylsiloxy-terminated poly(dimethylsiloxane/methylhexenylsiloxane)
xvii) a combination of two or more of i) to xvi). Alternatively, starting material (A) may be selected from the group consisting of i) bis-dimethylvinylsiloxy-terminated polydimethylsiloxane,
x) bis-dimethylhexenylsiloxy-terminated polydimethylsiloxane, and a combination of both i) and x).

(B) Polydiorganosiloxane Gum

Starting material (B) in the composition described above is a polydiorganosiloxane gum ("gum"). The gum may comprise unit formula:

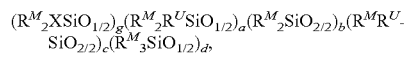

where $R^M$ and $R^U$ are as described above, X is a hydroxyl group, and the subscripts have values such that $0 \le g \le 2$, $0 \le a \le 2$, $0 \le d \le 2$, a quantity (g+a+d)=2, b≥0, c>0, and a quantity (b+c) has a value sufficient to give the gum a number average molecular weight ≥500,000 g/mol, alternatively 500,000 g/mol to 1,000,000 g/mol, and alternatively 600,000 g/mol to 800,000 g/mol. The quantity (a+c) may be sufficient to give the gum a vinyl content >0.1 weight %, alternatively >0.2 weight %, based on weight of the gum. Alternatively, the gum may have a vinyl content of 0.08 weight % to 1.2 weight %; alternatively >0.1 weight % to 1.2 weight %.

Polydiorganosiloxane gums are known in the art and may be prepared by methods such as hydrolysis and condensation of the corresponding organohalosilanes or equilibration of cyclic polydiorganosiloxanes. Examples of suitable polydiorganosiloxane gums for use in the composition are exemplified by:
i) bis-dimethylvinylsiloxy-terminated poly(dimethylsiloxane/methylvinylsiloxane),
ii) bis-dimethylvinylsiloxy-terminated polymethylvinylsiloxane,
iii) bis-trimethylsiloxy-terminated poly(dimethylsiloxane/methylvinylsiloxane),
iv) bis-trimethylsiloxy-terminated polymethylvinylsiloxane,
v) bis-dimethylhexenylsiloxy-terminated poly(dimethylsiloxane/methylhexenylsiloxane),
vi) bis-dimethylhexenylsiloxy-terminated polymethylhexenylsiloxane,
vii) bis-trimethylsiloxy-terminated poly(dimethylsiloxane/methylhexenylsiloxane),
viii) bis-trimethylsiloxy-terminated polymethylhexenylsiloxane,
ix) bis-dimethyl,hydroxylsiloxy-terminated poly(dimethylsiloxane/methylvinylsiloxane),
x) bis-dimethyl,hydroxylsiloxy-terminated polymethylvinylsiloxane,
xi) bis-dimethyl,hydroxylsiloxy-terminated poly(dimethylsiloxane/methylhexenylsiloxane),
xii) bis-dimethyl,hydroxylsiloxy-terminated polymethylhexenylsiloxane,
xiii) bis-dimethylvinylsiloxy-terminated poly(dimethylsiloxane/methylhexenylsiloxane),
xiv) bis-dimethylvinylsiloxy-terminated polymethylhexenylsiloxane,
xv) bis-dimethylhexenylsiloxy-terminated poly(dimethylsiloxane/methylvinylsiloxane),
xvi) bis-dimethylhexenylsiloxy-terminated polymethylvinylsiloxane,
xvii) a combination of two or more of i) to xvi). Alternatively, starting material (A) may be any one or more of i) to xii), described above.

The amount of starting material (B) in the composition depends on various factors including the vinyl content of the polymer selected for starting material (A) and the vinyl content of the gum selected for starting material (B), however, starting material (B) may be present in an amount of 5 weight parts to 20 weight parts, per 100 parts of starting material (A).

(C) Polyorganohydrogensiloxane Crosslinker

Starting material (C) in the composition is a polyorganohydrogensiloxane. The polyorganohydrogensiloxane may have unit formula:

$(R^M_3SiO_{1/2})_2(R^M_2SiO_{2/2})_e(HR^M_2SiO_{2/2})_f$, where $R^M$ is as described above, subscript e 0, subscript f≥3 and a quantity (e+f) is 4 to 500. Alternatively, the quantity (e+f) is sufficient to provide the polyorganohydrogensiloxane with an SiH content of 0.38 weight % to 2.0 weight %, alternatively 0.5% to 2%, alternatively 0.75% to 1.75%, alternatively 1.4% to 1.75%, and alternatively 0.76% to 1.6%, based on weight of the polyorganohydrogensiloxane.

Methods of preparing polyorganohydrogensiloxanes, such as hydrolysis and condensation of organohydridohalosilanes, are well known in the art. Suitable polyorganohydrogensiloxanes are exemplified by:
  i) trimethylsiloxy-terminated poly(dimethyl/methylhydrogen)siloxane,
  ii) trimethylsiloxy-terminated polymethylhydrogensiloxane,
  iii) a combination of both i) and ii). Alternatively, starting material (C) may be trimethylsiloxy-terminated polymethylhydrogensiloxane.

Starting material (C) is present in an amount sufficient to provide an SiH/Vi Ratio (as defined above) of >0.3, alternatively >0.4 to 1.7, alternatively >0.3 to 1.5, and alternatively 0.5 to 1.2 in the composition.

(D) (η-Cyclopentadienyl)tri(σ-aliphatic)-platinum Complex

Starting material (D) in the composition described above is a (η-cyclopentadienyl)tri(σ-aliphatic)-platinum complex. Suitable (η-cyclopentadienyl)tri(σ-aliphatic)-platinum complexes may be prepared as described in U.S. Pat. No. 4,510,094 to Drahnak, which is hereby incorporated by reference. Exemplary complexes useful in the composition described herein include the following, in which (Cp) is intended to mean (η-cyclopentadienyl) group: (Cp)trimethylplatinum, (Cp)ethyldimethylplatinum, (Cp)diethylmethylplatinum, (Cp) triethylplatinum, (Cp)triisopropylplatinum, (Cp)tri(2-butyl)platinum, (Cp)triallylplatinum, (Cp) tripentylplatinum, (Cp)trihexylplatinum, (Cp) trinonylplatinum, (Cp)tridodecylplatinum, (Cp) tricyclopentylplatinum, (Cp)tricyclohexylplatinum, trimethyl[(1,2,3,4,5-η)-1-methyl-2,4-cyclopentadien-1-yl]-[abbreviated (methyl-Cp)trimethylplatinum], (chloro-Cp) trimethylplatinum, (fluoro-Cp)trimethylplatinum, (Cp)dimethylbenzylplatinum, (methoxy-Cp)trimethylplatinum, (ethoxymethyl-Cp)ethyldimethylplatinum, (methyoxycarbonyl-Cp)trimethylplatinum, (1,3-dimethyl-Cp)trimethylplatinum, (methyl-Cp)triisopropylplatinum, (1,3-diacetyl-Cp)diethylmethylplatinum, (1,2,3,4,5-pentachloro-Cp) trimethylplatinum, (phenyl-Cp)trimethylplatinum, (Cp) acetyldimethylplatinum, (Cp)propionyldimethylplatinum, (Cp)acryloyldimethylplatinum, (Cp)di(methacryloyl)ethylplatinum, (Cp)dodecanoyldimethylplatinum, and a combination of two or more thereof. Alternatively, the complex for starting material (D) may be selected from the group consisting of: (Cp)trimethylplatinum, (Cp)ethyldimethylplatinum, (Cp)diethylmethylplatinum, (Cp) triethylplatinum, (Cp)triisopropylplatinum, (Cp)tri(2-butyl)platinum, (Cp)tripentylplatinum, (Cp)trihexylplatinum, (Cp)trinonylplatinum, (Cp)tridodecylplatinum, (Cp)tricyclopentylplatinum, (Cp)tricyclohexylplatinum, platinum, trimethyl [(1,2,3,4,5-η)-1-methyl-2,4-cyclopentadien-1-yl]-[abbreviated (methyl-Cp)trimethylplatinum], (1,3-dimethyl-Cp)trimethylplatinum, (methyl-Cp)triisopropylplatinum, and a combination of two or more thereof.

The amount of starting material (D) in the composition described above depends on various factors including the desired cure speed and the intensity of the radiation to be used to cure the composition, however, the amount of starting material (D) is sufficient to provide 1 ppm to 20 ppm of platinum based on combined weights of all starting materials in the silicone adhesive composition. Alternatively, the amount of starting material (D) may be sufficient to provide 5 ppm to 20 ppm, alternatively >5 ppm to <16 ppm, of platinum on the same basis.

(E) Solvent

The silicone adhesive composition may optionally further comprise (E) a solvent. The solvent may be added during preparation of the composition, for example, to aid mixing and delivery of one or more starting materials, such as starting material (D) described above. Suitable solvents include organic liquids exemplified by, but not limited to, aromatic hydrocarbons, aliphatic hydrocarbons, ketones, esters, ethers, glycols, glycol ethers, alkyl halides and aromatic halides. Hydrocarbons include benzene, toluene, xylene, naphtha, hexane, cyclohexane, methylcyclohexane, heptane, octane, decane, hexadecane, isoparaffin such as Isopar L (C11-C13), Isopar H(C11-C12), hydrogenated polydecene. Suitable ketones include, but are not limited to, acetone, methylethyl ketone, 2-pentanone, 3-pentanone, 2-hexanone, 2-heptanone, 4-heptanone, methyl isobutyl ketone, diisobutylketone, acetonylacetone, and cyclohexanone. Esters include ethyl acetate, propyl acetate, isopropyl acetate, butyl acetate, and isobutyl acetate Ethers include diethyl ether, dipropyl ether, diisopropyl ether, dibutyl ether, 1,2-dimethoxyethane, and 1,4-dioxane. Solvents having both ester and ether moieties include 2-methoxyethyl acetate, 2-ethoxyethyl acetate, propylene glycol monomethyl ether acetate, and 2-butoxyethyl acetate; Ethers and esters further include, isodecyl neopentanoate, neopentylglycol heptanoate, glycol distearate, dicaprylyl carbonate, diethylhexyl carbonate, propylene glycol n-propyl ether, propylene glycol-n-butyl ether, ethyl-3 ethoxypropionate, propylene glycol methyl ether acetate, tridecyl neopentanoate, propylene glycol methylether acetate (PG-MEA), propylene glycol methylether (PGME), dipropylene glycol methyl ether, or ethylene glycol n-butyl ether, octyldodecyl neopentanoate, diisobutyl adipate, diisopropyl adipate, propylene glycol dicaprylate/dicaprate, octyl ether, and octyl palmitate. Alternatively, the solvent may be selected from polyalkylsiloxanes, ketones, glycol ethers, tetrahydrofuran, mineral spirits, naphtha, or a combination thereof. Polyalkylsiloxanes with suitable vapor pressures may be used as the solvent, and these include hexamethyldisiloxane, octamethyltrisiloxane, hexamethylcyclotrisiloxane, octamethylcyclotetrasiloxane, decamethylcyclopentasiloxane, tris (trimethylsiloxy)methylsilane, tetrakis(trimethylsiloxy)silane, dodecamethylcyclohexasiloxane, octamethyltrisiloxane, decamethyltetrasiloxane, dodecamethylpentasiloxane, tetradecamethylhexasiloxane, hexadecamethylheptasiloxane, heptamethyl-3-{(trimethylsilyl)oxy}trisiloxane, hexamethyl-3,3, bis{(trimethylsilyl)oxy}trisiloxane pentamethyl{(trimethylsilyl)oxy}cyclotrisiloxane, and combinations thereof. Low molecular weight polyalkylsiloxanes, such as 0.5 to 1.5 cSt polydimethylsiloxanes are known in the art and commercially available as DOWSIL™ 200 Fluids and DOWSIL™ OS FLUIDS, which are commercially available from Dow Silicones Corporation. Alternatively, the solvent may be selected from the group consisting of an aliphatic hydrocarbon, an aromatic hydrocarbon, an ether, an ester, and a solvent having both ether and ester moieties.

The amount of solvent depends on various factors including the type and amount of each of starting materials (A), (B), (C), and (D) and their relative compatibilities with each other, and the type of equipment to be used to combine them. However, the amount of solvent may be 0 to 95% based on the weight of starting material (D). Alternatively, the amount of solvent added to the silicone adhesive composition may be 0 to 20 weight % based on combined weights of starting materials (A), (B), (C), and (D).

(F) Polyorganosilicate Resin

The silicone adhesive composition may optionally further comprise a polyorganosilicate resin comprising monofunctional units ("M" units) of formula $R^1_3SiO_{1/2}$ and tetrafunctional units ("Q" units) of formula $SiO_{4/2}$, where each $R^1$ is independently selected from the group consisting of $R^M$ and $R^U$, as described above. Alternatively, in the polyorganosilicate resin, each $R^1$ may be independently selected from the group consisting of alkyl, alkenyl and aryl. Alternatively, each $R^1$ may be selected from methyl, vinyl and phenyl. Alternatively, at least one-third, alternatively at least two thirds of the $R^1$ groups are methyl groups. Alternatively, the M units may be exemplified by $(Me_3SiO_{1/2})$, $(Me_2PhSiO_{1/2})$, and $(Me_2ViSiO_{1/2})$. The polyorganosilicate resin is soluble in solvents such as those described above, exemplified by liquid hydrocarbons, such as benzene, toluene, xylene, and heptane, or in liquid organosilicon compounds such as low viscosity linear and cyclic polydiorganosiloxanes.

When prepared, the polyorganosilicate resin comprises the M and Q units described above, and the polyorganosiloxane further comprises units with silanol (silicon bonded hydroxyl) groups and may comprise neopentamer of formula $Si(OSiR^1_3)_4$, where $R^1$ is as described above. $Si^{29}$ Nuclear Magnetic Resonance (NMR) spectroscopy, as described in U.S. Pat. No. 9,593,209 at col. 32, Reference Example 2, may be used to measure molar ratio of M and Q units, where said ratio is expressed as {M(resin)+(M(neopentamer)}/{Q(resin)+Q(neopentamer)} and represents the molar ratio of the total number of triorganosiloxy groups (M units) of the resinous and neopentamer portions of the polyorganosilicate resin to the total number of silicate groups (Q units) in the resinous and neopentamer portions.

The Mn of the polyorganosilicate resin depends on various factors including the types of hydrocarbyl groups represented by $R^1$ that are present. The Mn of the polyorganosilicate resin refers to the number average molecular weight measured using gel permeation chromatography (GPC) according to the procedure in U.S. Pat. No. 9,593,209 at col. 31, Reference Example 1, when the peak representing the neopentamer is excluded from the measurement. The Mn of the polyorganosilicate resin may be greater than 3,000 g/mol, alternatively >3,000 g/mol to 8,000 g/mol. Alternatively, Mn of the Polyorganosilicate Resin may be 4,500 g/mol to 7,500 g/mol.

U.S. Pat. No. 8,580,073 at col. 3, line 5 to col. 4, line 31, is hereby incorporated by reference for disclosing silicone resins, which are suitable polyorganosilicate resins for use herein. The polyorganosilicate resin can be prepared by any suitable method, such as cohydrolysis of the corresponding silanes or by silica hydrosol capping methods. The polyorganosilicate resin may be prepared by silica hydrosol capping processes such as those disclosed in U.S. Pat. No. 2,676,182 to Daudt, et al.; U.S. Pat. No. 4,611,042 to Rivers-Farrell et al.; and U.S. Pat. No. 4,774,310 to Butler, et al. The method of Daudt, et al. described above involves reacting a silica hydrosol under acidic conditions with a hydrolyzable triorganosilane such as trimethylchlorosilane, a siloxane such as hexamethyldisiloxane, or mixtures thereof, and recovering a copolymer having M units and Q units. The resulting copolymers generally contain from 2 to 5 percent by weight of silanol groups.

The intermediates used to prepare the polyorganosilicate resin may be triorganosilanes and silanes with four hydrolyzable substituents or alkali metal silicates. The triorganosilanes may have formula $R^1_3SiX^1$, where $R^1$ is as described above and $X^1$ represents a hydrolyzable substituent. Silanes with four hydrolyzable substituents may have formula $SiX^2_4$, where each $X^2$ is halogen, alkoxy or hydroxyl. Suitable alkali metal silicates include sodium silicate.

The polyorganosilicate resin prepared as described above typically contains silicon bonded hydroxyl groups, i.e., of formulae, $HOSi_{3/2}$ and/or $HOR^1_2SiO_{1/2}$. The polyorganosilicate resin may comprise up to 2% of silicon bonded hydroxyl groups. The concentration of silicon bonded hydroxyl groups present in the polyorganosilicate resin may be determined using Fourier Transform-Infra Red (FTIR) spectroscopy according to ASTM Standard E-168-16. For certain applications, it may desirable for the amount of silicon bonded hydroxyl groups to be below 0.7%, alternatively below 0.3%, alternatively less than 1%, and alternatively 0.3% to 0.8%. Silicon bonded hydroxyl groups formed during preparation of the polyorganosilicate resin can be converted to trihydrocarbyl siloxane groups or to a different hydrolyzable group by reacting the silicone resin with a silane, disiloxane, or disilazane containing the appropriate terminal group. Silanes containing hydrolyzable groups may be added in molar excess of the quantity required to react with the silicon bonded hydroxyl groups on the Polyorganosilicate Resin.

Alternatively, the polyorganosilicate resin may further comprises 2% or less, alternatively 0.7% or less, and alternatively 0.3% or less, and alternatively 0.3% to 0.8% of units represented by formula $X^1SiO_{3/2}$ and/or $X^1R^1SiO_{1/2}$ where $R^1$ and $X^1$ are as described above.

Alternatively, the polyorganosilicate resin may have terminal aliphatically unsaturated groups. The Polyorganosilicate Resin having terminal aliphatically unsaturated groups may be prepared by reacting the product of Daudt, et al. with an unsaturated organic group-containing endblocking agent and an endblocking agent free of aliphatic unsaturation, in an amount sufficient to provide from 3 to 30 mole percent of unsaturated organic groups in the final product. Examples of endblocking agents include, but are not limited to, silazanes, siloxanes, and silanes. Suitable endblocking agents are known in the art and exemplified in U.S. Pat. Nos. 4,584,355; 4,591,622; and 4,585,836. A single endblocking agent or a mixture of such agents may be used to prepare such resin.

Alternatively, the polyorganosilicate resin used herein may comprise unit formula:

where $R^M$ and $R^U$ are as described above, subscripts m, n, o, and p have values such that a quantity (m+n)>4, o>1, p is ≥0, and a quantity (m+n+o+p) is sufficient to give the resin a Mn of 1,500 to 8,000, alternatively 3,000 to 4,000 g/mol measured by GPC.

The amount of resin added to the silicone adhesive composition is 0 to <70%, alternatively 0 to <30%, based on combined weights of all starting materials in the silicone adhesive composition.

(G) Adhesion Promoter

The silicone adhesive composition may optionally further comprise (G) an adhesion promoter. Suitable adhesion promoters may comprise a transition metal chelate, a hydrocarbonoxysilane such as an alkoxysilane, a combination of an alkoxysilane and a hydroxy-functional polyorganosiloxane, or a combination thereof. Adhesion promoters are known in the art and may comprise silanes having the formula $R^3_rR^2_sSi(OR^4)_{4-(r+s)}$ where each $R^3$ is independently a monovalent organic group having at least 3 carbon atoms; $R^2$ contains at least one SiC bonded substituent having an adhesion-promoting group, such as amino, epoxy, or acrylate groups; subscript r has a value ranging from 0 to 2; subscript s is either 1 or 2; and the sum of (r+s) is not greater than 3. Each $R^4$ is independently a saturated hydrocarbon group. Saturated hydrocarbon groups for $R^4$ may be, for example, an alkyl group of 1 to 4 carbon atoms, alternatively 1 to 2 carbon atoms. $R^4$ is exemplified by methyl, ethyl, propyl, and butyl. Exemplary alkylalkoxysilane adhesion promoters include methyltrimethoxysilane, ethyltrimethoxysilane, methyltriethoxysilane, ethyltriethoxysilane, and combinations of two or more thereof. Alternatively, the adhesion promoter may comprise a partial condensate of the above silane. Alternatively, the adhesion promoter may comprise a partial condensate of the above silane. Alternatively, the adhesion promoter may comprise a combination of an alkoxysilane and a hydroxy-functional polyorganosiloxane.

Alternatively, the adhesion promoter may comprise an unsaturated or epoxy-functional compound. The adhesion promoter may comprise an unsaturated or epoxy-functional alkoxysilane. For example, the functional alkoxysilane can have the formula $R^5_tSi(OR^6)_{(4-t)}$, where subscript t is 1, 2, or 3, alternatively subscript t is 1. Each $R^5$ is independently a monovalent organic group with the proviso that at least one $R^5$ is an unsaturated organic group or an epoxy-functional organic group. Epoxy-functional organic groups for $R^5$ are exemplified by 3-glycidoxypropyl and (epoxycyclohexyl) ethyl. Unsaturated organic groups for $R^5$ are exemplified by 3-methacryloyloxypropyl, 3-acryloyloxypropyl, and unsaturated monovalent hydrocarbon groups such as vinyl, allyl, hexenyl, undecylenyl. Each $R^6$ is independently a saturated hydrocarbon group of 1 to 4 carbon atoms, alternatively 1 to 2 carbon atoms. $R^6$ is exemplified by methyl, ethyl, propyl, and butyl.

Examples of suitable epoxy-functional alkoxysilanes include 3-glycidoxypropyltrimethoxysilane, 3-g lycidoxypropyltriethoxysilane, (epoxycyclohexyl)ethyldimethoxysilane, (epoxycyclohexyl)ethyldiethoxysilane and combinations thereof. Examples of suitable unsaturated alkoxysilanes include vinyltrimethoxysilane, allyltrimethoxysilane, allyltriethoxysilane, hexenyltrimethoxysilane, undecylenyltrimethoxysilane, 3-methacryloyloxypropyl trimethoxysilane, 3-methacryloyloxypropyl triethoxysilane, 3-acryloyloxypropyl trimethoxysilane, 3-acryloyloxypropyl triethoxysilane, and combinations thereof.

Alternatively, the adhesion promoter may comprise an epoxy-functional siloxane such as a reaction product of a hydroxy-terminated polyorganosiloxane with an epoxy-functional alkoxysilane, as described above, or a physical blend of the hydroxy-terminated polyorganosiloxane with the epoxy-functional alkoxysilane. The adhesion promoter may comprise a combination of an epoxy-functional alkoxysilane and an epoxy-functional siloxane. For example, the adhesion promoter is exemplified by a mixture of 3-glycidoxypropyltrimethoxysilane and a reaction product of hydroxy-terminated methylvinylsiloxane with 3-glycidoxypropyltrimethoxysilane, or a mixture of 3-glycidoxypropyltrimethoxysilane and a hydroxy-terminated methylvinylsiloxane, or a mixture of 3-glycidoxypropyltrimethoxysilane and a hydroxy-terminated methylvinyl/dimethylsiloxane copolymer.

Alternatively, the adhesion promoter may comprise a transition metal chelate. Suitable transition metal chelates include titanates, zirconates such as zirconium acetylacetonate, aluminum chelates such as aluminum acetylacetonate, and combinations thereof. Alternatively, the adhesion promoter may comprise a combination of a transition metal chelate with an alkoxysilane, such as a combination of glycidoxypropyltrimethoxysilane with an aluminum chelate or a zirconium chelate.

The exact amount of adhesion promoter added to the composition described herein depends on various factors including the selection of starting materials (A), (B), and (C) and the desired adhesion to the target substrate, however, the amount of adhesion promoter may be 0 to 5 weight %, alternatively 0.1 weight % to 1 weight %, based on combined weight of all starting materials in the silicone adhesive composition.

Method of Making

The silicone adhesive composition may be prepared by any convenient means such as a method comprising: mixing all starting materials at RT and ambient pressure until homogeneous. The method may optionally comprise dissolving or dispersing one or more starting materials in solvent or adhesion promoter before use. For example, the catalyst (and/or the polyorganosilicate resin, if present, may be dissolved or dispersed in a solvent before combining with the other starting materials of the composition. The method may optionally further comprise removing all or a portion of the solvent, if present, before use. The composition may be prepared as a one-part composition. The starting materials are mixed under conditions to avoid exposure to UV radiation, such that cure is not initiated until the silicone adhesive composition is used.

Method of Use

The silicone adhesive composition described above may be applied on a substrate (e.g., by any convenient means such as dispensing, jetting or screen printing). The silicone adhesive composition is curable, and the curing reaction may be initiated by exposure to UV radiation. UV radiation means radiation with wavelength of 400 nm to 10 nm. UV radiation has been divided into four regions: near (400 nm-300 nm), middle (300 nm-200 nm), far (200 nm-100 nm), and extreme (below 100 nm).

For certain applications, it may be desirable to minimize the time and/or intensity of exposure to UV radiation to avoid or minimize damage to the substrates and/or adherends contacting the silicone adhesive composition and/or to speed up production. For example, a method for fabricating an electronic device may include:

1) applying the silicone adhesive composition described above on a substrate;

optionally 2) removing all or a portion of the solvent, if present;

3) exposing the silicone adhesive composition to UV radiation, thereby initiating a curing reaction of the silicone adhesive composition; and 4) holding an adherend on the silicone adhesive composition opposite the substrate, for a time sufficient to develop green strength, thereby producing a laminate article. The substrate may be a backside of an OLED display. The adherend may be a fingerprint sensor. Green strength may be measured as Shore 00 to 50 A hardness according to ASTM D2240-00. Without wishing to be bound by theory, it is thought that green strength may develop within 2 minutes after irradiation, alternatively within <1 to 2 minutes, when the UV radiation is near UV radiation (e.g., 365 nm) at an intensity of 1 J/cm$^2$ to 3 J/cm$^2$ in this application. Step 3) may be performed under pressure, e.g., sufficient pressure to apply the adherend to the silicone adhesive composition without damage to the adherend and the substrate. The method may be performed at RT, and the silicone adhesive composition will cure to form the silicone adhesive. RT cure may take several hours, e.g., 6 hours to 8 hours. Alternatively, the method may optionally further comprise 5) heating the laminate article, e.g., at a temperature and for a time sufficient to accelerate cure of the silicone adhesive composition to form the silicone adhesive, such as 50° C. to 100° C. for 1 min to 1 hour.

EXAMPLES

These examples are intended to illustrate the invention to one skilled in the art and are not to be interpreted as limiting the scope of the invention set forth in the claims. The starting materials in Table 1 were used in these examples.

TABLE 1

| Name | Structure | Source |
|---|---|---|
| (A-1) | bis-vinyldimethylsiloxy-terminated polydimethylsiloxane with DP = 329 | Dow Silicones Corporation |
| (A-2) | bis-trimethylsiloxy-terminated poly(dimethylsiloxane/methylvinylsiloxane) with vinyl content = 0.5% and Mn = 67,000 by GPC | Dow Silicones Corporation |
| (A-3) | bis-vinyldimethylsiloxy-terminated polydimethylsiloxane with DP = 800 to 1,000 and vinyl content of 0.06% to 0.09% | Dow Silicones Corporation |
| (A-4) | bis-vinyldimethylsiloxy-terminated polydimethylsiloxane with DP = 19.74 | Dow Silicones Corporation |
| (B-1) | bis-trimethylsiloxy-terminated poly(dimethylsiloxane/methylhexenylsiloxane) copolymer with 0.77% vinyl | Dow Silicones Corporation |
| (B-2) | Hexenyl functional gum containing 0.22% vinyl | Dow Silicones Corporation |
| (B-3) | a bis-dimethylvinylsiloxy-terminated poly(dimethylsiloxane/methylhexenylsiloxane) copolymer unit formula $M^{Vi}D_{5731}D^{Vi}{}_{91}M^{Vi}$ having vinyl content = 0.75%, where $M^{Vi}$ represents a unit of formula $(Me_2ViSiO_{1/2})$, D represents a unit of formula $(Me_2SiO_{2/2})$ and $D^{Vi}$ represents a unit of formula $(MeViSiO_{2/2})$ | Dow Silicones Corporation |
| (B-4) | a bis-silanol-terminated poly(dimethylsiloxane/methylhexenylsiloxane) copolymer gum of unit formula $M^{OH}{}_2D_xD^{Vi}{}_y$ and having 1.3% vinyl | Dow Silicones Corporation |
| (C-1) | bis-trimethylsiloxy-terminated polymethylhydrogensiloxane with viscosity 18-40 mm$^2$/s at 25° C., DP of 30 to 35, and 1.4 to 1.75% SiH | Dow Silicones Corporation |
| (D-1) | A solution of (trimethyl) methylcyclopentadienylplatinum (IV) (5%) dissolved in toluene (95%) | (trimethyl) methylcyclopentadienylplatinum (IV) was purchased from TCI Korea and dissolved in toluene |
| (D-2) | A solution of (trimethyl) methylcyclopentadienylplatinum (IV) (5%) dissolved in methyltrimethoxsilane (95%) | (trimethyl) methylcyclopentadienylplatinum (IV) was purchased from TCI Korea and dissolved in methyltrimethoxysilane |

TABLE 1-continued

| Name | Structure | Source |
|---|---|---|
| (F-1) | mixture of 33% poly(trimethyl,dimethylvinyl)silicate resin and 67% bis-vinyl-terminated polydimethylsiloxane polymer. | Dow Silicones Corporation |
| MTM (G-1) | methyltrimethoxysilane | DOWSIL™ Z-6070 Silane from Dow Silicones Corporation |

DOWSIL™, SILASTIC™, and SYL-OFF™ branded materials are commercially available from Dow Silicones Corporation of Midland, Michigan, USA.

In this Reference Example 1, silicone adhesive composition samples were prepared as follows. All starting materials, in the amounts set forth in Tables 2-5, below, were combined in a vessel and mixed until homogeneous. Amounts are shown in weight parts.

In this Reference Example 2, the samples prepared as in Reference Example 1 were tested for flowability after UV radiation exposure, as follows. One drop of the composition was placed on a horizontal glass slide and exposed to UV radiation using an LED UV lamp emitting radiation with wavelength 365 nm for 1 second to <10 seconds. Each sample was exposed to 1 J/cm$^2$ or 3 J/cm$^2$, as shown below in Table 2. After UV exposure, each glass slide was oriented vertically and the flow of the sample was monitored. Whether the sample was flowable and its cure form are shown below in Tables 2-5.

Gel time after UV exposure was measured on the samples prepared as described in Reference Example 1, as follows. One drop of the composition was placed on a horizontal glass slide and exposed to UV radiation using an LED UV lamp emitting radiation with wavelength 365 nm for 1 second to <10 seconds. Each sample was exposed to 1 J/cm$^2$ or 3 J/cm$^2$, as shown below in Table 2. The surface of the sample was touched with a syringe needle, which was then pulled up. The time when the sample became elastic, i.e., before becoming elastic, the sample was a liquid, which would attach to the needle and appear stringy when pulled up. When the stringiness stopped, the time was recorded. Gel time was recorded in Tables 2-5, below.

TABLE 2

| | Working Examples 1-4 (W1-W4) | | | |
|---|---|---|---|---|
| Starting Material | W1 | W2 | W3 | W4 |
| (A-1) | 100 | 100 | 100 | 100 |
| (B-1) | 5 | 20 | 5 | 20 |
| (C-1) | 0.3 | 1 | 0.3 | 1 |
| (D-1) | 0.05 | 0.06 | 0.02 | 0.03 |
| Total | 105.35 | 121.06 | 105.32 | 121.03 |
| ppm Pt from catalyst | 14.48 | 15.12 | 5.79 | 6.30 |
| SiH/Vi Ratio | 0.53 | 1.14 | 0.53 | 1.14 |
| Flowable after 1 J/cm$^2$ exposure? | No | No | No | No |
| Cure Form | Soft Gel | Elastomer | Soft Gel | Elastomer |
| Gel Time (min) | 1 | 1 | 2 | 2 |
| Flowable after 3 J/cm$^2$ exposure? | No | No | No | No |
| Cure form | Soft Gel | Elastomer | Soft Gel | Elastomer |
| Gel Time (min) | <1 | <1 | <1 | <1 |

TABLE 3

| | Comparative Examples 1-8 (C1-C8) | | | | | | | |
|---|---|---|---|---|---|---|---|---|
| Starting Material | C1 | C2 | C3 | C4 | C5 | C6 | C7 | C8 |
| (A-2) | 100 | 100 | 100 | 100 | 0 | 0 | 0 | 0 |
| (A-3) | 0 | 0 | 0 | 0 | 100 | 100 | 100 | 100 |
| (C-1) | 0.4 | 0.3 | 1.5 | 1.5 | 0.07 | 0.3 | 0.3 | 0.3 |
| (D-1) | 0.05 | 0.7 | 0.05 | 0.7 | 0.05 | 0.05 | 1 | 1 |
| Total | 100.45 | 101.00 | 101.55 | 102.20 | 100.12 | 100.35 | 101.30 | 101.30 |
| ppm Pt from catalyst | 15.18 | 211.39 | 15.02 | 208.90 | 15.23 | 15.20 | 301.09 | 301.09 |
| SiH/Vi Ratio | 0.36 | 0.27 | 1.35 | 1.35 | 0.34 | 1.47 | 1.47 | 1.47 |
| Flowable after 1 J/cm$^2$ exposure? | Yes | Yes | Yes | Yes | Yes | Yes | Yes | Yes |
| Cure Form | Soft Gel | Soft Gel | Elastomer | Elastomer | Soft Gel | Elastomer | Soft Gel | Elastomer |
| Gel Time (min) | 20 | 10 | 15 | 10 | 30 | 25 | 15 | 15 |
| Flowable after 3 J/cm$^2$ exposure? | No | No | No | No | No | No | No | No |
| Cure Form | Soft Gel | Soft Gel | Elastomer | Elastomer | Soft Gel | Elastomer | Soft Gel | Elastomer |
| Gel Time (min) | 15 | 2 | 15 | 3 | 25 | 25 | 5 | 5 |

Comparative Examples C1, C3, C5, and C6 showed that when starting material (B), the gum, was not present, the samples had much higher gel time (slower development of green strength) than Examples W1 and W2, which had comparable catalyst (ppm Pt) loading. Comparative Examples C2, C4, C7, and C8 showed that increasing the catalyst loading without starting material (B) failed to solve this problem; each of these comparative examples had undesirably high gel time.

TABLE 4

| Starting Material | W5 | W6 | W7 | W8 |
|---|---|---|---|---|
| A-1 | 100 | 100 | 100 | 100 |
| B-2 | 5 | 20 | 5 | 20 |
| C-1 | 0.3 | 1 | 0.3 | 1 |
| D-1 | 0.05 | 0.06 | 0.02 | 0.03 |
| Total | 105.35 | 121.06 | 105.32 | 121.03 |
| ppm Pt | 14.48 | 15.12 | 5.79 | 7.56 |
| SiH/Vi Ratio | 0.59 | 1.70 | 0.59 | 1.70 |
| SiH, mole | 0.48 | 1.60 | 0.48 | 1.60 |
| Vi, mole | 0.82 | 0.94 | 0.82 | 0.94 |
| Flowable after 1 J/cm$^2$ exposure? | No | No | No | No |
| Cure Form | Soft Gel | Elastomer | Soft Gel | Elastomer |
| Gel Time (min) | 1 | 1 | 2 | 2 |
| Flowable after 3 J/cm$^2$ exposure? | No | No | No | No |
| Cure Form | Soft Gel | Elastomer | Soft Gel | Elastomer |
| Gel Time (min) | <1 | <1 | <1 | <1 |

TABLE 5

|  | W9 | W10 | W11 | W12 | W13 | W14 | W15 | W16 |
|---|---|---|---|---|---|---|---|---|
| A-1 | 100 | 100 | 100 | 100 | 100 | 100 | 100 | 100 |
| B-3 | 5 | 20 | 5 | 20 | 0 | 0 | 0 | 0 |
| B-4 | 0 | 0 | 0 | 0 | 5 | 20 | 5 | 20 |
| C-1 | 0.3 | 1 | 0.3 | 1 | 0.3 | 1 | 0.3 | 1 |
| D-1 | 0.05 | 0.06 | 0.02 | 0.03 | 0.05 | 0.06 | 0.02 | 0.03 |
| Total | 105.35 | 121.06 | 105.32 | 121.03 | 105.35 | 121.06 | 105.32 | 121.03 |
| ppm Pt | 14.48 | 15.12 | 5.79 | 7.56 | 14.48 | 15.12 | 5.79 | 7.56 |
| SiH/Vi Ratio | 0.52 | 1.20 | 0.52 | 1.20 | 0.47 | 0.92 | 0.47 | 0.92 |
| SiH, mole | 0.48 | 1.60 | 0.48 | 1.60 | 0.48 | 1.60 | 0.48 | 1.60 |
| Vi, mole | 0.92 | 1.33 | 0.92 | 1.33 | 1.02 | 1.74 | 1.02 | 1.74 |
| Flowable after 1 J/cm$^2$ exposure? | No | No | No | No | No | No | No | No |
| Cure Form | Soft Gel | Elastomer | Soft Gel | Elastomer | Soft Gel | Elastomer | Soft Gel | Elastomer |
| Gel Time (min) | 1 | 1 | 2 | 2 | 1 | 1 | 2 | 2 |
| Flowable after 3 J/cm$^2$ exposure? | No | No | No | No | No | No | No | No |
| Cure Form | Soft Gel | Elastomer | Soft Gel | Elastomer | Soft Gel | Elastomer | Soft Gel | Elastomer |
| Gel Time (min) | <1 | <1 | <1 | <1 | <1 | <1 | <1 | <1 |

Example 17

A silicone adhesive composition was prepared by mixing, at RT, 14.4 weight parts of gum (B-1), 67.12 weight parts of polymer (A-1) (SFD-117), 10 weight parts of resin (F-1), 0.75 weight parts of adhesion promoter (G-1), 7.7 weight parts of polymer (A-4), and 0.03 weight parts of catalyst solution (D-2). The resulting silicone adhesive composition had SiH/Vi ratio of 0.7 and contained 9.15 ppm platinum. Samples were evaluated as described above, and the results are shown below in Table 6.

TABLE 6

| Flowable after 1 J/cm$^2$ exposure? | No |
|---|---|
| Cure Form | Tough elastomer |
| Gel Time (min) | 1 min |
| Flowable after 3 J/cm$^2$ exposure? | No |
| Cure Form | Tough elastomer |
| Gel Time (min) | <1 min |

INDUSTRIAL APPLICABILITY

Previously disclosed hydrosilylation reaction curable compositions include high catalyst loadings (e.g., >50 ppm Pt) and high dosage of UV radiation (e.g., 20 to 120 Watts) to cure. And, even with these high catalyst loading and UV radiation dosage, the gel time of such compositions was too slow for certain applications, such as applications where rapid formation of green strength is desired.

By using a polydiorganosiloxane gum with high vinyl content (starting material (B) described above) in a silicone adhesive composition, the catalyst loading may be reduced to <50 ppm Pt while also reducing UV radiation dosage for initiating cure of the composition to form green strength (B-stage curing).

Definitions and Usage of Terms

All amounts, ratios, and percentages herein are by weight, unless otherwise indicated. The SUMMARY and ABSTRACT are hereby incorporated by reference. The term "comprise" and its derivatives such as "comprises" and "comprising" are used herein in their broadest sense to mean and encompass the notions of "including," "include," "consist(ing) essentially of," and "consist(ing) of. The use of "for example," "e.g.," "such as," and "including" to list illustrative examples does not limit to only the listed examples. Thus, "for example" or "such as" means "for example, but not limited to" or "such as, but not limited to" and encompasses other similar or equivalent examples. The abbreviations used herein have the definitions in Table 7.

TABLE 7

Abbreviations

| Abbreviation | Definition |
|---|---|
| cm | centimeter |
| DP | degree of polymerization |
| g | grams |
| g/in | grams per inch |
| g/mol | grams per mole |
| GPC | gel permeation chromatography |
| J | Joules |
| kg | kilogram |
| m | meters |
| Me | methyl |
| min | minutes |
| mm | millimeters |
| Mn | number average molecular weight, which may be measured by GPC as disclosed in U.S. Pat. No. 9,593,209, Reference Example 1 at col. 31 |
| mPa · s | megaPascal seconds |
| NMR | Nuclear Magnetic Resonance: the 29 Si NMR technique described in U.S. Pat. No. 9,593,209, Reference Example 2 at col. 32 can be used to measure molar ratios of M to Q siloxy units in polyorganosilicate resins. |
| PET | polyethylene terephthalate |
| Ph | phenyl |
| RT | room temperature of 25° C. ± 5° C. |
| μm | micrometers |
| UV | Ultra-violet |
| Vi | vinyl |

The invention has been described in an illustrative manner, and it is to be understood that the terminology which has been used is intended to be in the nature of words of description rather than of limitation. With respect to any Markush groups relied upon herein for describing particular features or aspects, different, special, and/or unexpected results may be obtained from each member of the respective Markush group independent from all other Markush members. Each member of a Markush group may be relied upon individually and or in combination and provides adequate support for specific embodiments within the scope of the appended claims.

Furthermore, any ranges and subranges relied upon in describing the present invention independently and collectively fall within the scope of the appended claims, and are understood to describe and contemplate all ranges including whole and/or fractional values therein, even if such values are not expressly written herein. One of skill in the art readily recognizes that the enumerated ranges and subranges sufficiently describe and enable various embodiments of the present invention, and such ranges and subranges may be further delineated into relevant halves, thirds, quarters, fifths, and so on. As just one example, a range of "1 to 30" may be further delineated into a lower third, i.e., 1 to 10, a middle third, i.e., 11 to 20, and an upper third, i.e., from 21 to 30, which individually and collectively are within the scope of the appended claims, and may be relied upon individually and/or collectively and provide adequate support for specific embodiments within the scope of the appended claims. In addition, with respect to the language which defines or modifies a range, such as "at least," "greater than," "less than," "no more than," and the like, it is to be understood that such language includes subranges and/or an upper or lower limit.

The invention claimed is:

1. A silicone adhesive composition comprising:
   100 parts by weight of (A) a bis-vinyl-terminated polydiorganosiloxane polymer comprising unit formula:

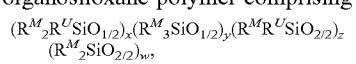

where each $R^M$ is an independently selected monovalent hydrocarbon group of 1 to 30 carbon atoms that is free of aliphatic unsaturation; each $R^U$ is a group of formula $CH_2=CH-D-$, where each D is a covalent bond or an independently selected divalent hydrocarbon group of 1 to 28 carbon atoms; subscripts w, x, y, and z have values such that $x \geq 0$, $y \geq 0$, $(x+y)=2$, $z \geq 0$, and $w \geq 0$, a quantity $(x+z) > 0$, and a quantity $(z+w)$ is sufficient to give the polydiorganosiloxane polymer a number average molecular weight of 10,000 g/mol to 300,000 g/mol;

5 to 20 parts by weight of (B) a polydiorganosiloxane gum comprising unit formula:

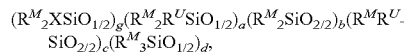

where $R^M$ and $R^U$ are as described above, X is a hydroxyl group, and subscripts g, a, b, c, and d have values such that $0 \leq g \leq 2$, $0 \leq a \leq 2$, $0 \leq d \leq 2$, a quantity $(g+a+d)=2$, $b \geq 0$, $c > 0$, a quantity $(b+c)$ has a value sufficient to give the gum a number average molecular weight $\geq 500,000$ g/mol, and where c has a value sufficient to provide the polydiorganosiloxane gum with a vinyl content $\geq 0.1$ weight % based on weight of the gum, where vinyl content of starting material (B) refers to the amount of groups of formula $(CH_2=CH-)$ bonded to carbon and/or silicon atoms in starting material (B);

(C) a polyorganohydrogensiloxane crosslinker, in an amount sufficient to provide an SiH/Vi ratio of >0.3, where SiH/Vi ratio is defined as the molar amount of silicon bonded hydrogen atoms in starting material (C) divided by the molar amount of groups of formula $(CH_2=CH-)$ bonded to carbon and/or silicon atoms in in starting materials (A) and (B) combined; and (D) a (η-cyclopentadienyl)tri(σ-aliphatic)-platinum complex, in an amount sufficient to provide 1 to 20 ppm Pt based on combined weights of all starting materials in the composition.

2. The composition of claim 1, where starting material (A) is selected from the group consisting of i) bis-dimethylvinylsiloxy-terminated polydimethylsiloxane, x) bis-dimethylhexenylsiloxy-terminated polydimethylsiloxane, and a combination of both i) and x).

3. The composition of claim 1, where starting material (B) has Mn of 500,000 g/mol to 1,000,000 g/mol and is selected from the group consisting of:
   i) bis-dimethylvinylsiloxy-terminated poly(dimethylsiloxane/methylvinylsiloxane),
   ii) bis-dimethylvinylsiloxy-terminated polymethylvinylsiloxane,
   iii) bis-trimethylsiloxy-terminated poly(dimethylsiloxane/methylvinylsiloxane),
   iv) bis-trimethylsiloxy-terminated polymethylvinylsiloxane,
   v) bis-dimethylhexenylsiloxy-terminated poly(dimethylsiloxane/methylhexenylsiloxane),
   vi) bis-dimethylhexenylsiloxy-terminated polymethylhexenylsiloxane,
   vii) bis-trimethylsiloxy-terminated poly(dimethylsiloxane/methylhexenylsiloxane),
   viii) bis-trimethylsiloxy-terminated polymethylhexenylsiloxane,
   ix) bis-dimethyl,hydroxylsiloxy-terminated poly(dimethylsiloxane/methylvinylsiloxane),
   x) bis-dimethyl,hydroxylsiloxy-terminated polymethylvinylsiloxane, xi) bis-dimethyl,hydroxylsiloxy-terminated poly(dimethylsiloxane/methylhexenylsiloxane), xii) bis-dimethyl,hydroxylsiloxy-terminated polymethylhexenylsiloxane, and a combination of any two or more of i) to xii).

4. The composition of claim 1, where starting material (C) comprises a trimethylsiloxy-terminated polymethylhydrogensiloxane.

5. The composition of claim 1, where SiH/Vi ratio is >0.4 to 1.7.

6. The composition of claim 1, where starting material (D) is Platinum, trimethyl[(1,2,3,4,5-η)-1-methyl-2,4-cyclopentadien-1-yl]-.

7. The composition of claim 1, where starting material (D) is present in an amount sufficient to provide 5 ppm to 20 ppm of platinum.

8. The composition of claim 7, where the amount is sufficient to provide >5 ppm to <16 ppm platinum.

9. The composition of claim 1, further comprising an additional starting material selected from the group consisting of (E) a solvent, (F) a polyorganosilicate resin, (G) an adhesion promoter, and (H) a combination of two or more of (E), (F), and (G).

10. A method for preparing the silicone adhesive composition of claim 1 comprising mixing all starting materials.

11. A method for fabricating an electronic device, the method comprising:
1) dispensing the silicone adhesive composition of claim 1 on a substrate, optionally 2) removing all or a portion of (E) the solvent, when present, 3) exposing the silicone adhesive composition to near UV radiation, thereby initiating a curing reaction of the silicone adhesive composition;

4) Holding an adherend on the silicone adhesive composition opposite the substrate, thereby producing a laminate article; and optionally 5) heating the laminate article.

12. The method of claim 11, where the substrate is a backside of an OLED display.

13. The method of claim 11, where the adherend is a fingerprint sensor.

14. The method of claim 11, where UV exposure in step 3) is 1 J/cm$^2$ to 3 J/cm$^2$.

15. The method of claim 11, where step 4) is completed after <1 min to 2 min.

* * * * *